(12) United States Patent
Groe et al.

(10) Patent No.: US 7,412,213 B1
(45) Date of Patent: Aug. 12, 2008

(54) ENVELOPE LIMITING FOR POLAR MODULATORS

(75) Inventors: John B. Groe, Poway, CA (US); Carl Thomas Hardin, Encinitas, CA (US); Mahbuba Sheba, San Diego, CA (US)

(73) Assignee: Sequoia Communications, San Diego, CA (US)

( * ) Notice: Subject to any disclaimer, the term of this patent is extended or adjusted under 35 U.S.C. 154(b) by 0 days.

(21) Appl. No.: 11/538,396

(22) Filed: Oct. 3, 2006

Related U.S. Application Data

(63) Continuation of application No. 10/202,501, filed on Jul. 23, 2002, now Pat. No. 7,171,170.

(60) Provisional application No. 60/307,346, filed on Jul. 23, 2001.

(51) Int. Cl.
*H04B 1/02* (2006.01)
*H03C 3/38* (2006.01)

(52) U.S. Cl. .................... 455/108; 455/110; 455/127.2; 332/145

(58) Field of Classification Search ................. 455/108, 455/110, 114.1, 114.2, 116, 127.1, 127.2; 375/296, 297; 332/144, 145, 149, 157
See application file for complete search history.

(56) References Cited

U.S. PATENT DOCUMENTS

| | | | |
|---|---|---|---|
| 4,263,560 A | 4/1981 | Ricker | |
| 4,430,627 A | 2/1984 | Machida | |
| 4,769,588 A | 9/1988 | Panther | |
| 4,816,772 A | 3/1989 | Klotz | |
| 4,926,135 A | 5/1990 | Voorman | |
| 4,965,531 A | 10/1990 | Riley | |
| 5,006,818 A | 4/1991 | Koyama et al. | |
| 5,015,968 A | 5/1991 | Podell et al. | |
| 5,030,923 A | 7/1991 | Arai | |
| 5,289,136 A | 2/1994 | DeVeirman et al. | |
| 5,331,292 A | 7/1994 | Worden et al. | |
| 5,399,990 A | 3/1995 | Miyake | |
| 5,491,450 A | 2/1996 | Helms et al. | |
| 5,508,660 A | 4/1996 | Gersbach et al. | |
| 5,548,594 A | 8/1996 | Nakamura | |
| 5,561,385 A | 10/1996 | Choi | |
| 5,581,216 A | 12/1996 | Ruetz | |
| 5,625,325 A | 4/1997 | Rotzoll et al. | |
| 5,631,587 A | 5/1997 | Co et al. | |
| 5,648,744 A | 7/1997 | Prakash et al. | |
| 5,677,646 A | 10/1997 | Entrikin | |
| 5,739,730 A | 4/1998 | Rotzoll | |
| 5,767,748 A | 6/1998 | Nakao | |
| 5,818,303 A | 10/1998 | Oishi et al. | |
| 5,834,987 A | 11/1998 | Dent | |
| 5,862,465 A | 1/1999 | Ou | |
| 5,878,101 A | 3/1999 | Aisaka | |

(Continued)

*Primary Examiner*—Nguyen Vo
(74) *Attorney, Agent, or Firm*—Cooley Godward Kronish LLP

(57) ABSTRACT

Envelope limiting for a polar modulator. A system is provided that intelligently compresses the amplitude modulation in a polar modulator so that it can be implemented with a single-stage variable gain amplifier. Limiting the amplitude modulation range on the low side prevents collapse of the transmit signal's time-varying envelope and eases circuit implementation. Limiting the amplitude modulation range on the high side reduces the peak-to-average ratio of the waveform and thereby improves the efficiency of the radio transmitter.

9 Claims, 3 Drawing Sheets

U.S. PATENT DOCUMENTS

| | | | |
|---|---|---|---|
| 5,880,631 A | 3/1999 | Sahota | |
| 5,939,922 A | 8/1999 | Umeda | |
| 5,945,855 A | 8/1999 | Momtaz | |
| 5,949,286 A | 9/1999 | Jones | |
| 5,990,740 A | 11/1999 | Groe | |
| 5,994,959 A | 11/1999 | Ainsworth | |
| 5,999,056 A | 12/1999 | Fong | |
| 6,011,437 A | 1/2000 | Sutardja et al. | |
| 6,018,651 A | 1/2000 | Bruckert et al. | |
| 6,031,425 A | 2/2000 | Hasegawa | |
| 6,044,124 A | 3/2000 | Monahan et al. | |
| 6,052,035 A | 4/2000 | Nolan et al. | |
| 6,057,739 A | 5/2000 | Crowley et al. | |
| 6,060,935 A | 5/2000 | Shulman | |
| 6,091,307 A | 7/2000 | Nelson | |
| 6,100,767 A | 8/2000 | Sumi | |
| 6,114,920 A | 9/2000 | Moon et al. | |
| 6,163,207 A | 12/2000 | Kattner et al. | |
| 6,173,011 B1 | 1/2001 | Rey et al. | |
| 6,191,956 B1 | 2/2001 | Foreman | |
| 6,204,728 B1 | 3/2001 | Hageraats | |
| 6,211,737 B1 | 4/2001 | Fong | |
| 6,229,374 B1 | 5/2001 | Tammone, Jr. | |
| 6,246,289 B1 | 6/2001 | Pisati et al. | |
| 6,255,889 B1 | 7/2001 | Branson | |
| 6,259,321 B1 | 7/2001 | Song et al. | |
| 6,288,609 B1 | 9/2001 | Brueske et al. | |
| 6,298,093 B1 | 10/2001 | Genrich | |
| 6,333,675 B1 | 12/2001 | Saito | |
| 6,370,372 B1 | 4/2002 | Molnar et al. | |
| 6,392,487 B1 | 5/2002 | Alexanian | |
| 6,404,252 B1 | 6/2002 | Wilsch | |
| 6,476,660 B1 | 11/2002 | Visocchi et al. | |
| 6,515,553 B1 | 2/2003 | Filiol et al. | |
| 6,559,717 B1 | 5/2003 | Lynn et al. | |
| 6,560,448 B1 | 5/2003 | Baldwin et al. | |
| 6,571,083 B1 | 5/2003 | Powell, II et al. | |
| 6,577,190 B2 | 6/2003 | Kim | |
| 6,583,671 B2 | 6/2003 | Chatwin | |
| 6,583,675 B2 | 6/2003 | Gomez | |
| 6,639,474 B2 | 10/2003 | Asikainen et al. | |
| 6,664,865 B2 | 12/2003 | Groe et al. | |
| 6,683,509 B2 | 1/2004 | Albon et al. | |
| 6,693,977 B2 | 2/2004 | Katayama et al. | |
| 6,703,887 B2 | 3/2004 | Groe | |
| 6,711,391 B1 | 3/2004 | Walker et al. | |
| 6,724,235 B2 | 4/2004 | Costa et al. | |
| 6,734,736 B2 | 5/2004 | Gharpurey | |
| 6,744,319 B2 | 6/2004 | Kim | |
| 6,751,272 B1 | 6/2004 | Burns et al. | |
| 6,753,738 B1 | 6/2004 | Baird | |
| 6,763,228 B2 | 7/2004 | Prentice et al. | |
| 6,774,740 B1 | 8/2004 | Groe | |
| 6,777,999 B2 | 8/2004 | Kanou et al. | |
| 6,781,425 B2 | 8/2004 | Si | |
| 6,795,843 B1 | 9/2004 | Groe | |
| 6,798,290 B2 | 9/2004 | Groe et al. | |
| 6,801,089 B2 | 10/2004 | Costa et al. | |
| 6,845,139 B2 | 1/2005 | Gibbons | |
| 6,856,205 B1 | 2/2005 | Groe | |
| 6,870,411 B2 | 3/2005 | Shibahara et al. | |
| 6,917,791 B2 * | 7/2005 | Chadwick | 455/126 |
| 6,940,356 B2 | 9/2005 | McDonald, II et al. | |
| 6,943,600 B2 | 9/2005 | Craninckx | |
| 6,975,687 B2 | 12/2005 | Jackson et al. | |
| 6,985,703 B2 | 1/2006 | Groe et al. | |
| 6,990,327 B2 | 1/2006 | Zheng et al. | |
| 7,062,248 B2 | 6/2006 | Kuiri | |
| 7,065,334 B1 | 6/2006 | Otaka et al. | |
| 7,088,979 B1 | 8/2006 | Shenoy et al. | |
| 7,123,102 B2 | 10/2006 | Uozumi et al. | |
| 7,142,062 B2 | 11/2006 | Vaananen et al. | |
| 7,148,764 B2 | 12/2006 | Kasahara et al. | |
| 7,171,170 B2 * | 1/2007 | Groe et al. | 455/108 |
| 7,215,215 B2 | 5/2007 | Hirano et al. | |
| 2002/0071497 A1 | 6/2002 | Bengtsson et al. | |
| 2002/0135428 A1 | 9/2002 | Gomez | |
| 2002/0193009 A1 | 12/2002 | Reed | |
| 2003/0078016 A1 | 4/2003 | Groe et al. | |
| 2003/0092405 A1 | 5/2003 | Groe et al. | |
| 2003/0118143 A1 | 6/2003 | Bellaouar et al. | |
| 2003/0197564 A1 | 10/2003 | Humphreys et al. | |
| 2004/0017852 A1 | 1/2004 | Redman-White | |
| 2004/0051590 A1 | 3/2004 | Perrott et al. | |
| 2005/0093631 A1 | 5/2005 | Groe | |
| 2005/0099232 A1 | 5/2005 | Groe et al. | |
| 2006/0003720 A1 | 1/2006 | Lee et al. | |

* cited by examiner

ENVELOPE LIMITING FOR POLAR MODULATORS

CROSS REFERENCE TO RELATED APPLICATIONS

This application is a continuation application of U.S. patent application entitled "ENVELOPE LIMITING FOR POLAR MODULATORS," Ser. No. 10/202,501, filed Jul. 23, 2002, issued as U.S. Pat. No. 7,171,170, which claims the benefit of priority of a now abandoned U.S. Provisional Patent Application entitled "ENVELOPE LIMITING FOR POLAR MODULATORS" Ser. No. 60/307,346 filed on Jul. 23, 2001, the disclosures of which are hereby incorporated by reference in their entirety for all purposes.

FIELD OF THE INVENTION

The present invention relates generally to communication systems, and more particularly, to a communication transmitter using digital modulation with a time-varying envelope.

BACKGROUND OF THE INVENTION

Modern communications systems increasingly rely on digital modulation techniques for reliable system performance. These techniques modulate a carrier signal by varying its phase and/or amplitude.

The heterodyne architecture is standard for radio transmitters. It uses rectangular (in-phase and quadrature-phase) data and I/Q modulation to generate the transmit signal. This architecture handles phase and amplitude modulation equally well, but also produces spurious mixing products, delivers only moderate linearity, and suffers from poor efficiency.

A more efficient radio transmitter architecture is referred to as a polar modulator. This architecture eliminates several circuits, avoids mixing operations, and improves efficiency. It also introduces a new challenge, separate amplitude and phase control. The separate control is complicated by some modulation formats that null the envelope of the transmit signal. It would therefore be advantageous to reduce the amplitude modulation while still preserving the quality of the transmit signal.

SUMMARY OF THE INVENTION

The present invention includes a system that intelligently compresses the amplitude modulation in polar modulators so that it can be implemented with a single-stage variable gain amplifier. Limiting the amplitude modulation range on the low side prevents collapse of the transmit signal's time-varying envelope and eases circuit implementation. Limiting the amplitude modulation range on the high side reduces the peak-to-average ratio of the waveform and thereby improves the efficiency of the radio transmitter. The limiting operation affects performance only slightly since it occurs infrequently, during the transitions between certain symbols, and at low transmits levels.

In one embodiment, a method is provided for improving the efficiency of a radio transmitter that uses polar modulation. The method comprises the steps of interpreting radio configuration parameters that indicate a peak-to-average ratio of a transmit signal, analyzing a power control signal to determine a transmit level, re-shaping an amplitude modulation signal, and adjusting the power control signal.

In one embodiment, a method is provided for re-shaping an amplitude modulation signal of a radio transmitter. The method comprises the steps of limiting a maximum level of the amplitude modulation signal based on a peak-to-average ratio of a transmit signal and a power control level, restricting a minimum level of the amplitude modulation signal based on the power control signal and selected distortion requirements, and controlling a single variable gain amplifier stage with the amplitude modulation signal.

In one embodiment, a radio transmitter is provided that comprises a control circuit for improving the efficiency of the radio transmitter's polar modulator. The control circuit comprises logic to set amplitude modulation data to an upper threshold level when a modulation signal exceeds the upper threshold level, logic to set the amplitude modulation data to a lower threshold level when the modulation signal falls below the lower threshold level, and logic to transfer a portion of a power control signal to a variable gain amplifier stage based on the amplitude modulation data.

BRIEF DESCRIPTION OF THE DRAWINGS

The foregoing aspects and the attendant advantages of this invention will become more readily apparent by reference to the following detailed description when taken in conjunction with the accompanying drawings wherein.

DETAILED DESCRIPTION

The present invention includes a system that intelligently compresses the amplitude modulation in polar modulators so that it can be implemented with a single-stage variable gain amplifier.

In one embodiment, the present invention intelligently limits the amplitude modulation signal by "clipping" its peaks and/or "softening" its nulls to allow envelope control by a single variable gain amplifier stage.

Figure 1A:
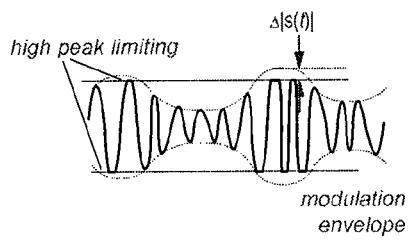
FIG. 1a illustrates high peak clipping envelope-limiting in accordance with the present invention.
Figure 1B:
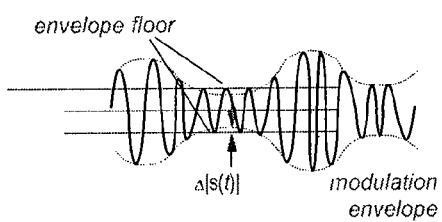
FIG. 1b illustrates low peak floor envelope-limiting in accordance with the present invention.
Figure 2A:
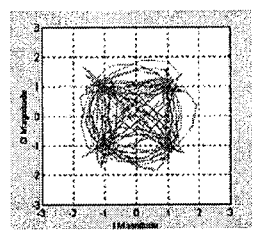
FIGS. 2a-d show the effects of reducing the high peaks in an FIR-filtered QPSK-modulated signal, where (a) shows a constellation diagram, (b) shows envelope variation, (c) shows a frequency spectrum, and (d) shows an amplitude probability distribution.
Figure 2B:
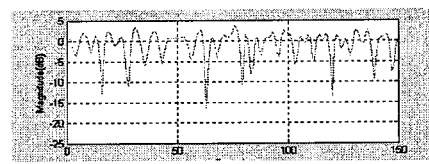
Figure 2C:
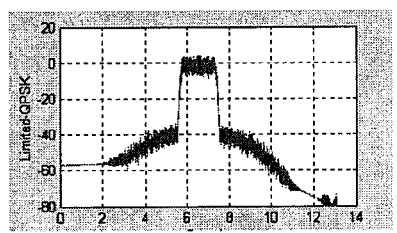
Figure 2D:
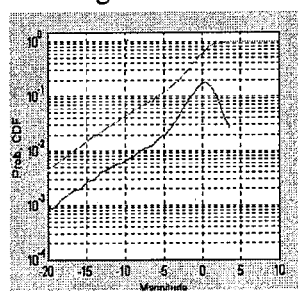
Figure 3A:
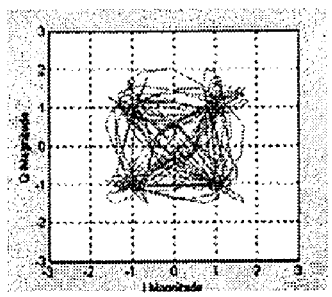
FIGS. 3a-d show the effects of limiting the low peaks in an FIR-filtered QPSK-modulated signal, where (a) shows a constellation diagram, (b) shows envelope variation, (c) shows a frequency spectrum, and (d) shows an amplitude probability distribution.
Figure 3B:
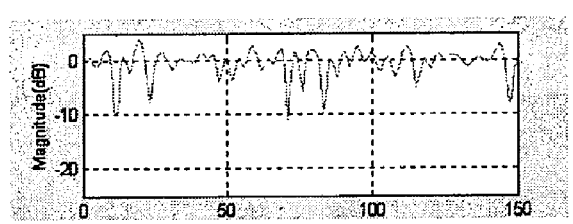
Figure 3C:
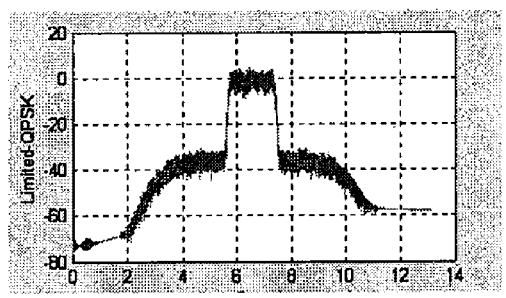
Figure 3D:
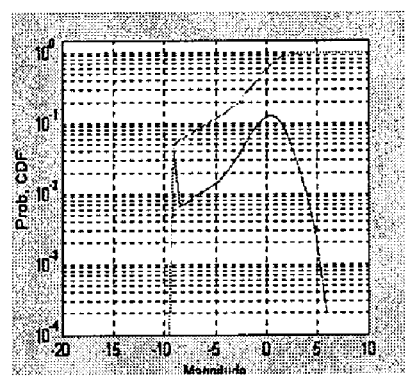

FIGS. 1a and 1b illustrate envelope limiting in accordance with the present invention. Clipping the amplitude modulation signal restricts the maximum level of the transmit signal's envelope and introduces distortion but also improves system efficiency since this allows the transmitter to operate at lower DC power levels. Preferably, the clipping is generally limited to a few dB or less to avoid severely affecting the transmit signal. FIG. 2 illustrates the effects of 2 dB limiting on the FIR-filtered QPSK-modulated signal. For example, FIGS. 2a-d show (a) a constellation diagram, (b) envelope variation, (c) a frequency spectrum, and (d) an amplitude probability distribution;

Softening the nulls of the amplitude modulation signal, as shown in FIG. 1b, sets the minimum level for the transmit signal's envelope and reduces the control range to a reasonable amount, allowing for single-point control. FIG. 3 illustrates the effects of limiting the low peaks to 15 dB below the modulated signal's peak amplitude. For example, FIGS. 3a-d show (a) a constellation diagram, (b) envelope variation, (c) a frequency spectrum, and (d) an amplitude probability distribution.

Figure 4:
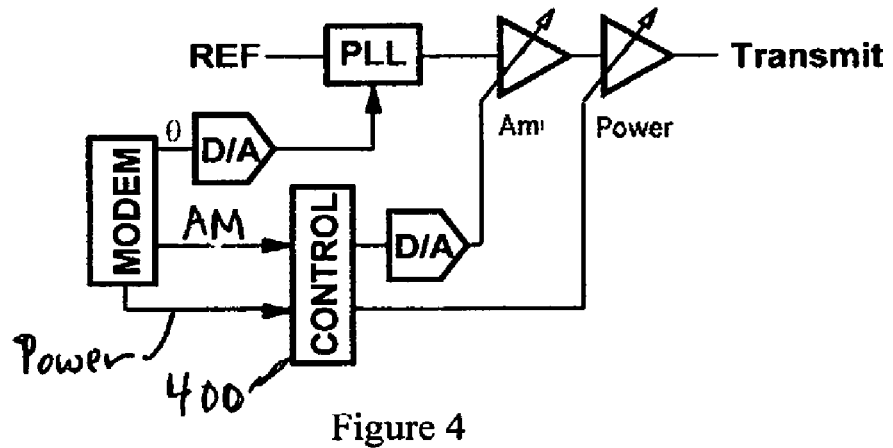
FIG. 4 shows an envelope-limiting circuit as part of the polar modulator constructed in accordance with the present invention.
Figure 5:
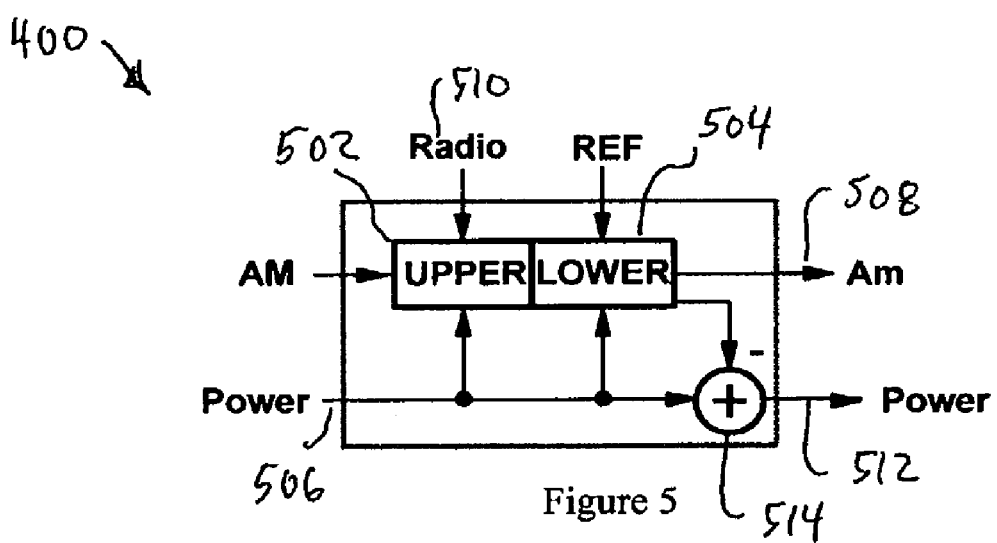
FIG. 5 shows a detailed diagram of the envelope-limiting circuit of FIG. 4.

FIG. 4 shows an envelope-limiting circuit 400 as part of a polar modulator constructed in accordance with the present invention. FIG. 5 shows a detailed diagram of the envelope-limiting circuit 400 of FIG. 4. The circuit includes upper adjustment logic 502 to adjust the high levels of the amplitude modulation signal (AM). The circuit also includes lower adjustment logic 504 to limit the low levels of the AM signal. Both the logic 502 and 504 comprises circuits that may be used to provide envelope limiting of the AM signal known to those with skill in the art.

The envelope-limiting circuit 400 monitors the power level of the transmit signal by comparing the power control signal 506 to a reference level (REF). The circuit also interprets radio configuration parameters 510 that indicate a peak-to-average ratio of a transmit signal. This information is then used to appropriately set the lower and upper limits of a modified amplitude control signal 508

At high transmit power levels, the control circuit moderately compresses the peaks of the amplitude modulation signal to deliver better efficiency. The lower limit is also set as low as possible to prevent spectral regrowth. In practice, the upper limit is dependant upon the peak-to-average ratio of the transmit signal (defined by the radio configuration parameters) and the linearity of the radio frequency amplifiers, while the lower limit is set by the control range of a single variable gain amplifier stage.

At low transmit power levels, the control circuit only softens the nulls of the amplitude modulation signal. The peaks are unaffected. In practice, the lower limit is set to meet distortion requirements, generally much more relaxed at lower transmit power levels. This further allows a portion of the variable gain amplifier's control range to be used for power control. For example, a modified power control signal 512 is produced after the envelope limiting is accounted for via adjustment logic 514.

The reference level provides a threshold for low transmit power levels, indicating relaxed spectral regrowth requirements. Below this reference level, the lower limit of the amplitude modulation signal is either raised gradually or in a single step.

The control circuit included in the present invention intelligently limits the amplitude modulation signal, reshaping the transmit signal's envelope while meeting spectral regrowth requirements, allowing amplitude control by a single variable gain amplifier stage, and extending the power control range of the radio transmitter. Minor modifications and changes to the described embodiments are possible without deviating from the scope of the invention.

The embodiments described herein are illustrative of the present invention and are not intended to limit the scope of the invention to the particular embodiments described. Accordingly, while one or more embodiments of the invention have been illustrated and described, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. In a radio transmitter including a polar modulator having an amplifier arrangement responsive to a control signal, a network for improving the efficiency of the polar modulator, the network comprising:
   logic to set the control signal to an upper threshold level when input amplitude modulation data provided to the polar modulator exceeds the upper threshold;
   logic to set the control signal to a lower threshold level when the input amplitude modulation data falls below the lower threshold;
   circuitry for applying the control signal to the amplifier arrangement.

2. The network of claim 1 further including adjustment logic for adjusting the level of a power control signal applied to the amplifier arrangement in accordance with the control signal.

3. The network of claim 1 wherein the logic to set the control signal to the upper threshold level comprises logic based on the peak-to-average ratio of a modulated transmit signal.

4. The network of claim 1, wherein the logic to set the control signal to the lower threshold level comprises logic responsive to a reference signal.

5. The network of claim 1 wherein the logic to set the control signal to the upper threshold level comprises logic based upon the cubic metric of a modulated transmit signal.

6. In a radio transmitter including a polar modulator having an amplifier arrangement responsive to an amplitude modulation control signal and a power control signal, a method for improving the efficiency of the polar modulator, the method comprising:
   setting the amplitude modulation control signal to an upper threshold level when input amplitude modulation data provided to the polar modulator exceeds the upper threshold;
   setting the amplitude modulation control signal to a lower threshold level when the input amplitude modulation data falls below the lower threshold; and
   adjusting the power control signal in response to the amplitude modulation control signal.

7. The method of claim 6 wherein the setting the amplitude modulation control signal to the upper threshold level is performed in accordance with the peak-to-average ratio of a modulated transmit signal.

8. The method of claim 6 wherein the setting the amplitude modulation control signal to the lower threshold level is performed in accordance with a reference signal.

9. The method of claim 6 wherein the setting the amplitude modulation control signal to the upper threshold level is performed in accordance with the cubic metric of a modulated transmit signal.

* * * * *